United States Patent [19]

Schlick

[11] 4,141,247

[45] Feb. 27, 1979

[54] OPTICAL WARNING INDICATOR MEANS ON BIMETAL MEASURING ELEMENT

[75] Inventor: Horst Schlick, Schwalbach, Fed. Rep. of Germany

[73] Assignee: VDO Adolf Schindling AG, Frankfurt am Main, Fed. Rep. of Germany

[21] Appl. No.: 813,861

[22] Filed: Jul. 8, 1977

[30] Foreign Application Priority Data

Jul. 29, 1976 [DE] Fed. Rep. of Germany ....... 2634062

[51] Int. Cl.² ......................... G01D 5/28; G01K 5/70
[52] U.S. Cl. .................................. 73/363.5; 116/221; 250/230; 324/106
[58] Field of Search ........... 116/114 M, 114 P, 114 L, 116/DIG. 36, 114 Y, 116, 202; 250/230; 324/106; 73/363.5

[56] References Cited

U.S. PATENT DOCUMENTS

| | | | |
|---|---|---|---|
| 2,528,640 | 11/1950 | Coleman | 116/DIG. 37 |
| 2,840,698 | 6/1958 | Bercovitz, Jr. | 250/230 X |
| 3,606,151 | 9/1971 | Dumast et al. | 250/230 X |
| 3,631,341 | 12/1970 | Kazuno | 324/106 |

FOREIGN PATENT DOCUMENTS 1206597  9/1970  United Kingdom ..................... 116/116

Primary Examiner—Daniel M. Yasich
Attorney, Agent, or Firm—Otto John Munz

[57] ABSTRACT

An indicator includes a dial having a translucent section supported on a housing, a light beam directed along a path through the housing such that light is not normally received at the translucent section, a measuring element movable within the housing in accordance with a condition to be sensed and a reflector carried by the measuring element and movable therewith to intersect the light beam path to reflect the light beam to the translucent section when a predetermined condition is sensed.

6 Claims, 2 Drawing Figures

OPTICAL WARNING INDICATOR MEANS ON BIMETAL MEASURING ELEMENT

BACKGROUND OF THE INVENTION

1. Field of the Invention

The present invention pertains to indicating instruments and, more particularly, to an indicator having a pointer movable relative to scale indicia on a dial having a translucent section which is illuminated by light upon the occurrence of a specific measured condition.

2. Discussion of the Prior Art

Prior art indicators having a translucent dial section adapted to be illuminated upon the occurrence of a specific measured condition are highly desirable due to the warning signal provided by illumination of such translucent sections. Such prior art indicators have conventionally utilized a cover plate mounted on the shaft of the pointer such that the cover plate is movable between the translucent section and a source of light and permits the light to pass to the translucent section upon the occurrence of the specific measured condition. Such indicators have the disadvantage of being of substantially large volume due to the relatively large maximum diameter of the cover plate. Attempts to overcome this disadvantage by the use of photoconductors have resulted in a decreased structural volume; however, the use of photoconductors results in an increase in the number of required elements and therefore has the disadvantages of rendering the assembly of such indicators more complex and increasing the production costs thereof.

SUMMARY OF THE INVENTION

Accordingly, it is an object of the present invention to overcome the above mentioned disadvantages of the prior art by constructing an indicator having a translucent warning section of a reduced number of elements and minimal structural volume.

A primary object of the present invention is to utilize a reflector mounted on a movable measuring element of an indicator such that upon the occurrence of a specific measured condition or value, light is reflected to a translucent warning section of a dial of the indicator to illuminate the translucent section and provide an accentuated indication of existence of the condition.

Another object of the present invention is to provide means for illuminating a translucent warning section of an indicator dial without increasing the structural volume of the indicator by utilizing a small mirror mounted on a movable measuring element to intersect a light beam which is normally not directed at the translucent section.

The present invention has a further object in the use of a diaphragm mounted in a housing to define in combination with an incandescent lamp, a beam directed along a path through the housing such that stray light from the beam striking a translucent section of a dial is very small to produce a substantial contrast between illuminated and non-illuminated conditions of the translucent section. To increase the contrast and decrease stray light striking the translucent section, a tubular baffle is disposed on the inner side of the translucent section.

An additional object of the present invention is to use a U-shaped bimetal as a measuring element in an indicator, the bimetal having a first leg fixed to a housing for the indicator and a second leg carrying a current measuring winding and mounting a reflector which is movable with the bimetal to reflect light from a beam to a translucent warning section of a dial when a predetermined condition is sensed by the bimetal.

Some of the advantages of the present invention over the prior art are that the indicator of the present invention has a small structural volume that is not increased by the addition of the translucent warning section and a warning indication can be provided utilizing only an extremely small number of structural elements which are simple and inexpensive to assemble.

The present invention is generally characterized in an indicator including a housing, a dial supported on the housing and having a translucent section, a light source directing a light beam along a path through the housing such that light from the beam is not normally received at the translucent section, a measuring element disposed in the housing and movable therein in accordance with a condition to be sensed, and a reflector carried by the measuring element and movable therewith to intersect the path of the light beam to reflect the light beam to the translucent section when a predetermined condition is sensed whereby the translucent section is illuminated only when the predetermined condition is sensed.

Other objects and advantages of the present invention will become apparent from the following description of the preferred embodiment taken in conjunction with the accompanying drawings.

DESCRIPTION OF THE PREFERRED EMBODIMENT

Figure 1:
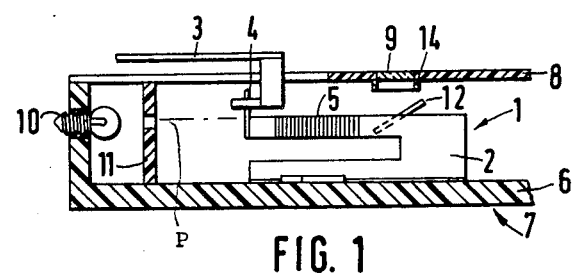
FIG. 1 is a side elevation, partly in section, of an indicator providing a warning signal in accordance with the present invention.
Figure 2:
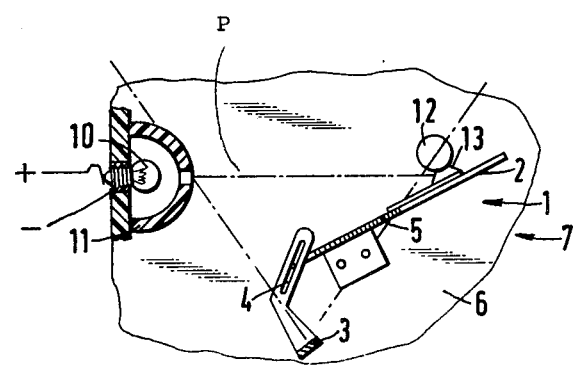
FIG. 2 is a broken plan view, partly in section, of the indicator of FIG. 1 with the dial removed.

An indicator producing a warning signal according to the present invention is shown in FIGS. 1 and 2 and includes a measuring element generally indicated at 1 including a bimetal 2 having a U-configuration with a first leg fixed to a base 6 of a housing 7 and a second leg connected with a pointer 3 via a pin-slot coupling 4. A current measuring coil 5 is carried on the movable second leg of the bimetal 2 to cause the bimetal to deflect with measurement of a condition causing current to flow through the winding and alter the temperature of the bimetal. The measuring element 1 is covered by a dial 8 supported on the housing and carrying scale indicia (not shown) for providing an indication of a measured condition by means of movement of pointer 3, the dial including a translucent warning section or window 9 made of a plastic material of a red color to provide a warning signal when illuminated.

An incandescent lamp 10 is mounted in a side wall of housing 7, and a diaphragm 11 is disposed in front of the lamp 10 to produce a light beam along a path P through the housing, the path of the light beam being such that light from the beam is not normally received at the translucent section 9. A reflector 12, such as a small mirror, is carried on the second leg of bimetal 2 by means of a supporting arm 13 extending therefrom, and the bimetal is movable in accordance with current passing through the winding 5 to cause the reflector to intersect the path of the light beam when a predetermined measured condition is sensed. The reflector 12 is disposed at an angle, as best shown in FIG. 1, to reflect the light beam toward the translucent warning section 9 when the light beam is intersected while, at all other times, the position of the reflector is such that the light beam is either not reflected at all or is reflected toward non-translucent portions of the dial 8. A tubular baffle element 14 is disposed on the inner side of the dial 8 facing the reflector in order to provide additional protection of the translucent section from stray light.

In operation, a condition to be measured causes current to flow in coil 5 thereby altering the temperature of bimetal 2 to cause movement thereof and corresponding movement of pointer 3 relative to the scale indicia on the dial 9. During this normal operation, the light beam passes through the housing along path P without being reflected to the translucent warning section 9; and, thus, this section is not backlighted or illuminated. Upon sensing of a predetermined condition, however, movement of the bimetal 2 will cause the reflector 12 to intersect the path P of the light beam and reflect light toward the translucent warning section to illuminate the same and provide an observer with an additional signal warning of existence of the predetermined condition. The tubular baffle element 14 is aligned with the reflector, as best shown in FIG. 1, to prevent stray light from illuminating the translucent section 9 of the dial during normal operation.

Inasmuch as the present invention is subject to many variations, modifications and changes in detail, it is intended that all subject matter described above or shown in the accompanying drawings be interpreted as illustrated and not in a limiting sense.

What is claimed is:

1. An indicator comprising housing means;
   dial means supported on said housing means carrying scale indicia thereon and having a translucent section therein, said dial means including baffle means to prevent stray light from illuminating said translucent section;
   a bimetal measuring element disposed in said housing means and movable therein in accordance with a condition to be sensed;
   a pointer coupled with said measuring element and movable along said scale indicia on said dial in response to movement of said measuring element providing an indication of the condition to be sensed;
   light means directing a light beam along a path through said housing means such that light from said beam is normally prevented from being received at said translucent section; and
   reflector means carried by said measuring element and movable therewith to intersect said path of said light beam to reflect said light beam to said translucent section when a predetermined condition is sensed whereby said translucent section is illuminated only when said predetermined condition is sensed.

2. An indicator as recited in claim 1 wherein said light means includes a lamp mounted in said housing means and a diaphragm mounted in said housing means to define said light beam.

3. An indicator as recited in claim 1 wherein said translucent section of said dial means has an inner side facing said reflector means and said baffle means includes a tubular baffle element disposed on said inner side of said translucent section to prevent stray light from illuminating said translucent section.

4. An indicator as recited in claim 1 wherein said bimetal measuring element has a U-configuration with a first leg fixed to said housing means and a second leg carrying a current measuring winding and coupled with said pointer.

5. An indicator as recited in claim 4 wherein said reflector means includes a mirror supported on an arm extending from said second leg of said measuring element.

6. An indicator as recited in claim 5 wherein said translucent section has a red color to provide a warning indication when backlighted.

* * * * *